(12) United States Patent
Linliu

(10) Patent No.: US 6,263,586 B1
(45) Date of Patent: Jul. 24, 2001

(54) DEVICE AND METHOD FOR PLANARIZING A THIN FILM

(75) Inventor: Kung Linliu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 09/350,964

(22) Filed: Jul. 9, 1999

(30) Foreign Application Priority Data

Jun. 17, 1999 (TW) ................................. 88110181

(51) Int. Cl.$^7$ ...................................................... F26B 5/08
(52) U.S. Cl. ................... 34/312; 34/317; 34/328; 34/481; 34/58; 34/61; 427/241; 427/346; 438/632; 438/633; 438/760; 438/782
(58) Field of Search ........................... 34/312, 313, 314, 34/317, 328, 481, 58, 60, 61; 427/240, 241, 346, 422; 438/631, 632, 633, 760, 763, 782

(56) References Cited

U.S. PATENT DOCUMENTS

| | | | |
|---|---|---|---|
| 5,037,777 | * | 8/1991 | Mele et al. ............................. 437/195 |
| 5,104,482 | * | 4/1992 | Monkowski et al. ................. 156/643 |
| 5,302,233 | * | 4/1994 | Kim et al. ............................. 156/636 |
| 5,500,243 | * | 3/1996 | Yang ................................. 427/126.3 |
| 5,679,641 | * | 10/1997 | Matsuda et al. . |
| 5,918,152 | * | 6/1999 | Erzhuang et al. .................... 438/782 |
| 5,925,410 | * | 7/1999 | Akram et al. . |
| 5,928,960 | * | 7/1999 | Green et al. ......................... 438/692 |

* cited by examiner

Primary Examiner—Pamela Wilson
(74) Attorney, Agent, or Firm—Jiawei Huang; J. C. Patents

(57) ABSTRACT

A device and method for planarizing a film layer device on a silicon wafer. The device has a circular track whose surface faces the track center, a carrier capable of moving along the track and carrying wafers around with their front surfaces facing the center, and a set of heating elements for heating the film layers on the wafers to make them fluid. Utilizing the centrifugal force on the film layer generated by the circular movement and the fluidity of the film layer provided by heating, planarization of the film layer is achieved.

8 Claims, 4 Drawing Sheets

US 6,263,586 B1

DEVICE AND METHOD FOR PLANARIZING A THIN FILM

CROSS-REFERENCE TO RELATED APPLICATION

This application claims the priority benefit of Taiwan application serial no. 88110181, filed Jun. 17, 1999, the full disclosure of which is incorporated herein by reference.

BACKGROUND OF THE INVENTION

1. Field of Invention

The present invention relates to a semiconductor manufacturing device and a method. More particularly, the present invention relates to a device and method for planarizing a film layer.

2. Description of Related Art

As semiconductor manufacturing passes into the deep submicron scale, dimensions of each device shrink. Hence, a higher operating speed for each integrated circuit results. For an integrated circuit with the same device layout, operating speed is closely related to density of the devices.

One major problem often encountered in metal plug fabrication, damascene processes or the deposition of a layer of dielectric material between neighboring lines or devices is the gap-filling capability of the material involved. Following the reduction of device dimensions and width of circuit lines, device density increases. In the process of filling the gaps or trenches on a silicon wafer, voids may be formed especially when the gaps or trenches are smaller than 0.1 $\mu$m.

FIG. 1 is a schematic, cross-sectional view after forming an inter-layer dielectric (ILD) layer over a substrate that has circuit lines thereon in a multi-level metallization process. As shown in FIG. 1, metal lines 110 are formed on a substrate 100 so that there is a gap 120 between two neighboring metal lines 110. A dielectric layer 130 is formed over the substrate and the metal lines 110. Due to the poor gap-filling capability of the deposited dielectric material when the dielectric layer 130 is formed, a void 140 is likely to form within the dielectric layer 130 inside the gap region 120. The void 140 not only can lead to poor insulation, but can also enclose some corrosive chemicals that can corrode the metallic lines 110 and result in circuit problems. In addition, too much topographical height difference H after the deposition of the dielectric layer 130 is likely to affect subsequent photolithographic and etching processes as well. This is because only a highly planar surface can avoid the problems due to light diffusion during exposure so that a clear pattern is transferred.

SUMMARY OF THE INVENTION

The invention provides a method for planarizing a film layer so that voids are eliminated and topographical height differences are reduced.

To achieve these and other advantages and in accordance with the purpose of the invention, as embodied and broadly described herein, the invention provides a method for planarizing a film layer. A film layer is deposited over a silicon wafer. The wafer is next placed inside a carrier with a front face of the wafer facing a centrifugal center. The wafer inside the carrier is heated so that the film layer becomes fluid. In the meantime, the wafer is also driven in a circular movement so that the film layer can be planarized.

The invention also provides a device for planarizing a film layer in semiconductor manufacturing. The device includes a circular track having a track surface that faces the track center, a carrier that moves along the track carrying silicon wafers around the track center, and a set of heating elements within the carrier and/or the track for heating the film layers on the wafers and making the film layers fluid.

According to this invention, silicon wafers having their front surfaces all facing the track center are placed inside the carrier. The carrier then runs on the track, and hence follows a circular path. The wafers are heated while the carrier is in motion so that the film layers on the wafers become fluid. The centrifugal force exerted on the thin films accelerate the movement of the film layer, thus planarizing the film layer and removing any voids therein.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
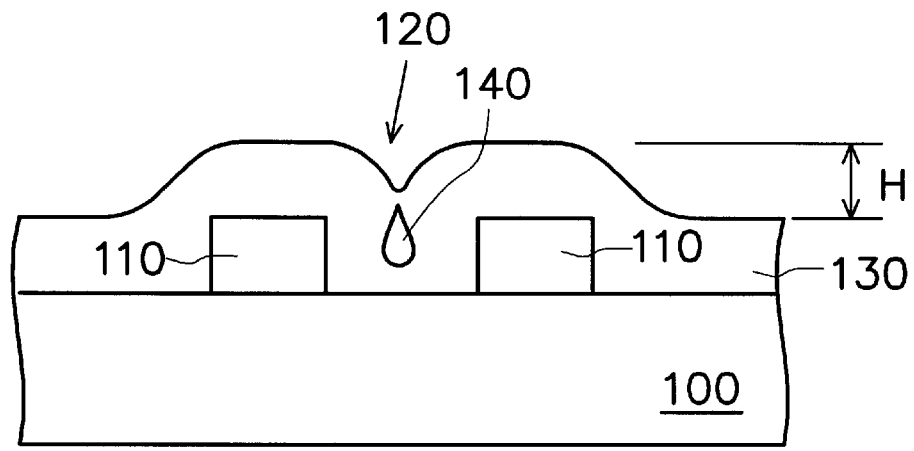
FIG. 1 is a schematic, cross-sectional view of a substrate that has circuit lines thereon in a multi-level metallization process and an inter-layer dielectric (ILD) layer thereover.

Reference will now be made in detail to the present preferred embodiments of the invention, examples of which are illustrated in the accompanying drawings. Wherever possible, the same reference numbers are used in the drawings and the description to refer to the same or like parts.

Figure 2A:
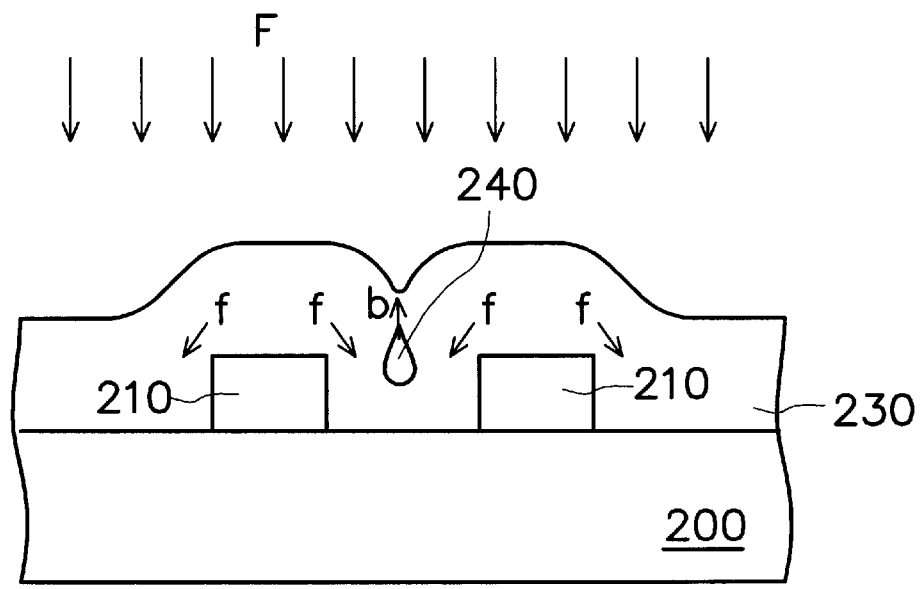
FIGS. 2A and 2B are schematic, cross-sectional views showing the process of planarizing a film layer according to this invention.
Figure 2B:
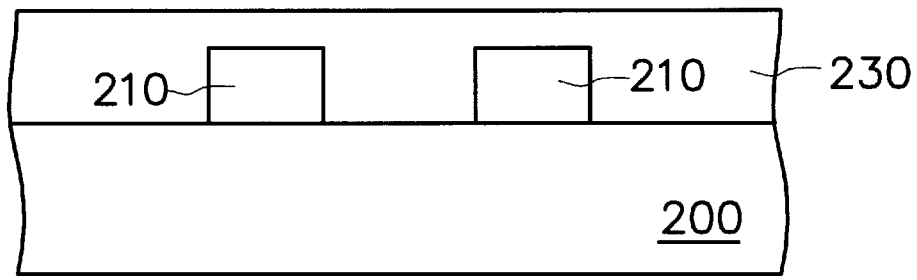

FIGS. 2A and 2B are schematic, cross-sectional views showing the process of planarizing a film layer according to this invention. The process of forming an interlayer dielectric (ILD) layer over a substrate that has circuit lines thereon in a multi-level metallization, similar to the one shown in FIG. 1, is used as an illustration.

As shown in FIG. 2A, metal lines 210 are formed on a substrate 200. A dielectric layer 230 is formed over the substrate and the metal lines 210 so that a void 240 is formed in a gap between two neighboring metal lines 210. When the substrate 200 is heated to a certain temperature, the dielectric layer 230 becomes fluid. In the meantime, if an external pressure F is applied to a top surface of the dielectric layer 230, the fluid dielectric layer 230 moves in a direction as indicated by a set of arrows f. Due to the downward pressure on the dielectric layer 230, the dielectric material on a top surface of the metal lines 210 is forced to move sideways down the sidewalls of the metal lines 210. As the dielectric material moves down towards the gap, the void 240 is forced to move up as indicated by an arrow b. When the void 240 reaches a top surface of the dielectric layer 230, the void 240 bursts open and disappears. Meanwhile, the dielectric material within the dielectric layer 230 continues to flow until all the voids inside the dielectric layer are removed and a level upper surface is formed as shown in FIG. 2B.

Figure 3A:
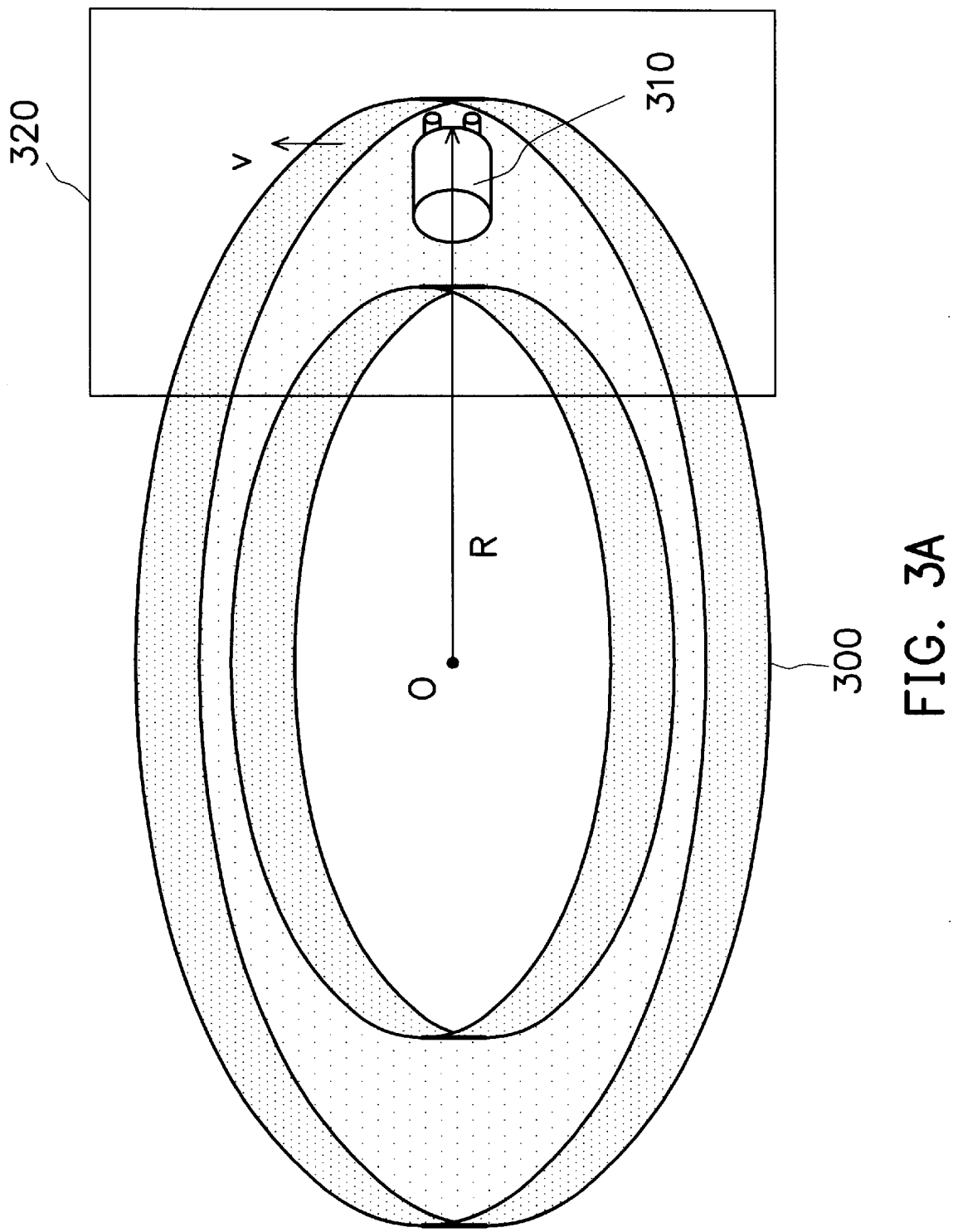
FIGS. 3A and 3B are sketches showing a device for planarizing a film layer according to one preferred embodiment of this invention.
Figure 3B:
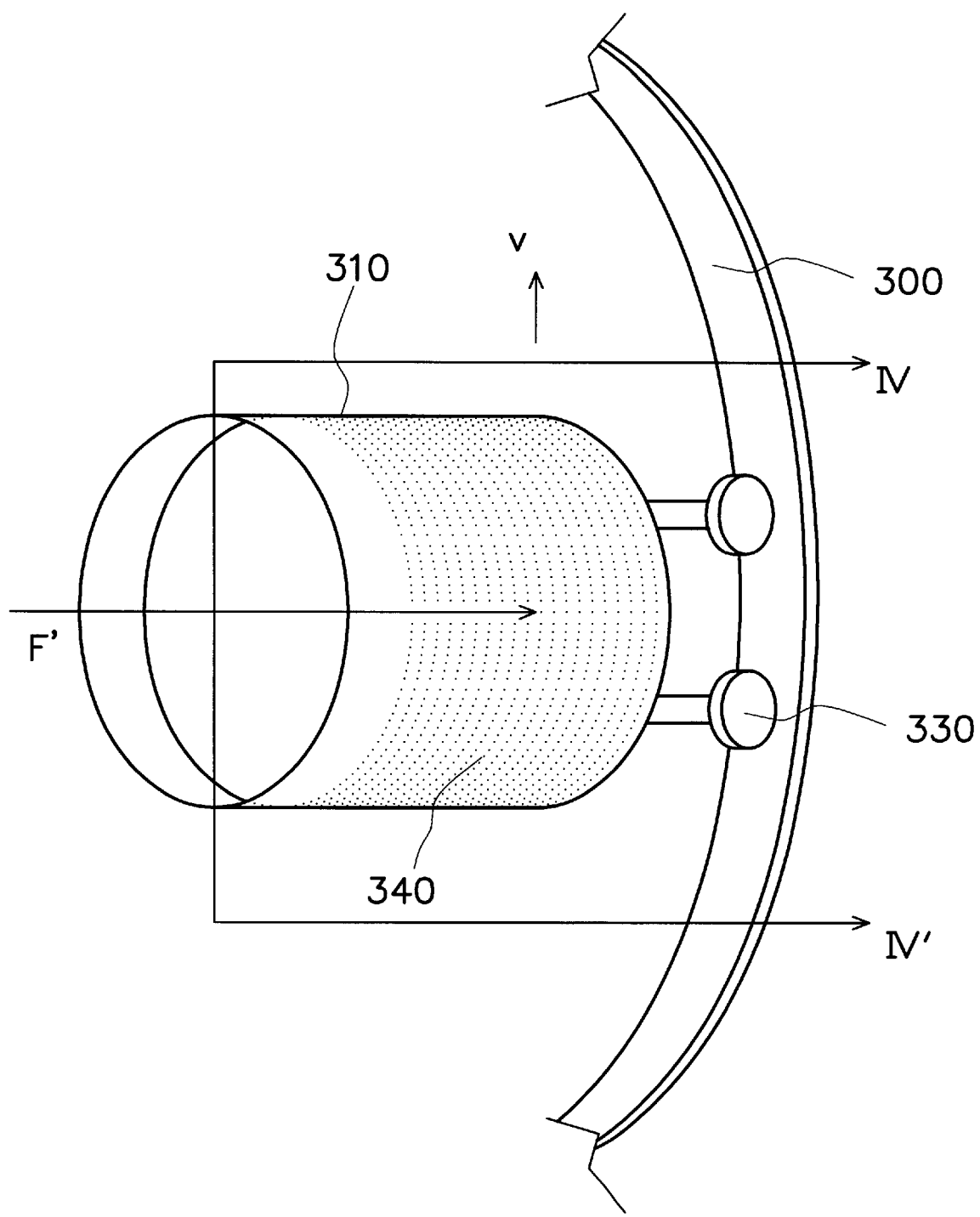

Utilizing the aforementioned theoretical consideration, a device capable of planarizing a film layer on a silicon wafer is designed. FIGS. 3A and 3B are sketches showing a device for planarizing a film layer according to one preferred embodiment of this invention. As shown in FIG. 3A, a circular track 300 having a center O and a radius R that permits a wafer carrier 310 to move along at a velocity v is provided. The wafer carrier 310 can be, for example, a small cart with a set of wheels below for engaging with the track 300. A magnified view of the area enclosed by a frame 310 in FIG. 3A is shown in FIG. 3B. FIG. 3B provides a clearer view of the carrier 310 moving at a velocity v using its set of wheels on the track 300. A stack of wafers 340 is placed inside the carrier 310 in such a way that their front surfaces all face the center O. When the carrier 310 moves in a circle along the track 300, a relative centrifugal force F' is exerted on a top surface of the wafer. Magnitude of the relative centrifugal force F' is given by the following formula:

$$F' = 1.118 \times 10^{-3} R \times N^2 \times g \qquad (1);$$

where F' is the relative centrifugal force (in g, g is the acceleration due to gravity, which is a value of 9.8 m/s$^2$), R is the radius of the track 300 (in m), N is the number of revolutions around the track 300 per minute (in rpm) and.

When the carrier 310 is moving at a suitable velocity v around the track 300, a relative centrifugal force F' having a magnitude of between 50 to 100 g can be created. The relative centrifugal force F' is able to planarize a fluid film layer on a wafer and remove any voids therein. The solid film layer can be converted to a fluid film layer by heating the wafer beyond its fluid transition temperature. Typically, a wafer can be heated up to a temperature of about 800° C. Of course, the temperature to which the wafer is heated depends on wafer processing consideration and fluidity of the film layer demanded. For example, if the film layer is made from aluminum/copper alloy, the alloy will start to melt at a temperature of about 400 to 500° C. when heated under atmospheric pressure.

Figure 4:
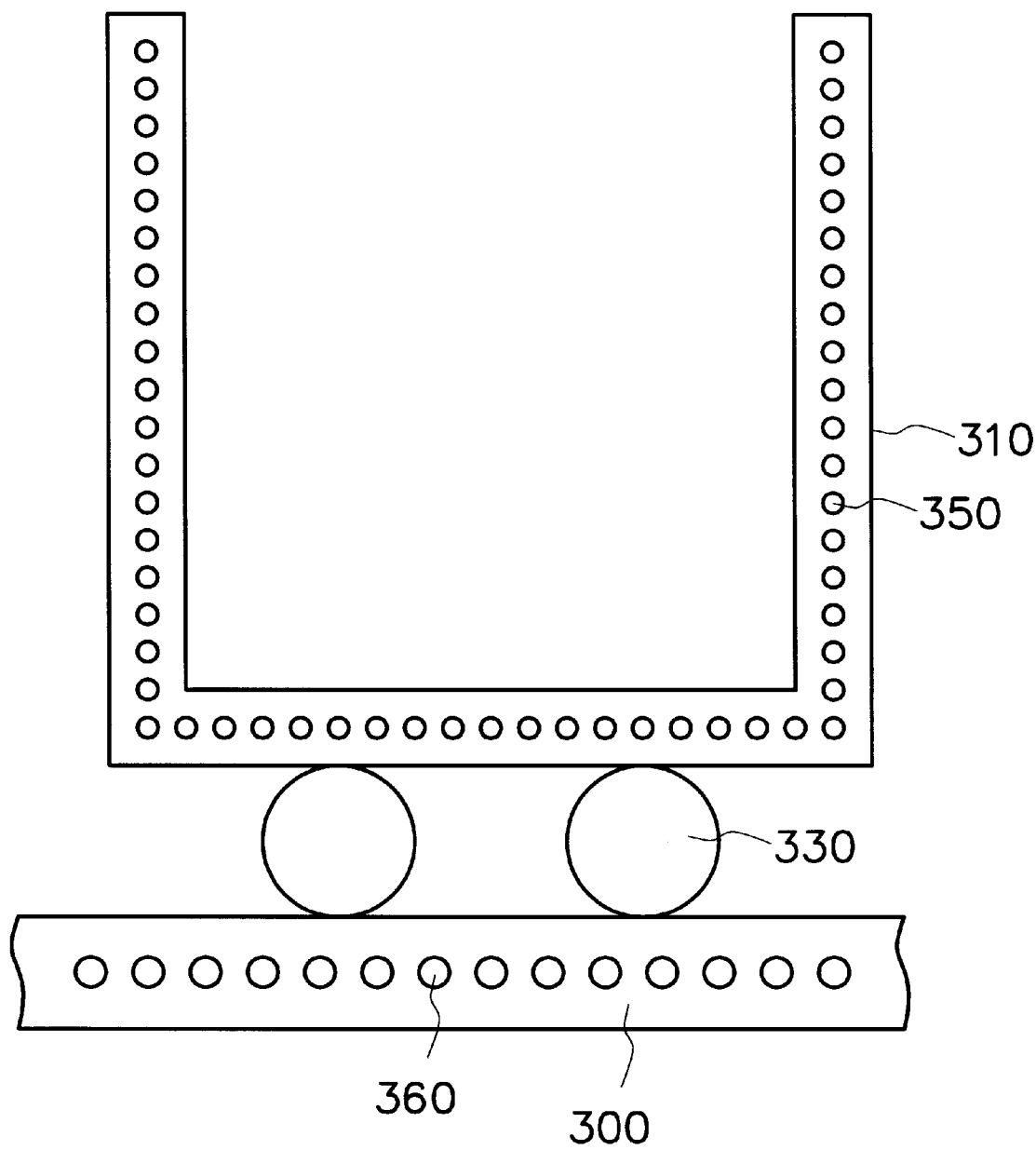
FIG. 4 is a schematic, cross-sectional view along line IV–IV' of FIG. 3B showing a set of heating elements for heating silicon wafers.

FIG. 4 is a schematic, cross-sectional view along line IV–IV' of FIG. 3B showing a set of heating elements for heating silicon wafers. The heating elements can be heating coils 350 and 360 that are installed inside the sidewalls of the carrier 310 and/or along the track 300, respectively.

As the relative centrifugal force F' is increased, effectiveness of the planarization increases so that a film layer may be planarized at a lower temperature or a lower fluidity level. According to formula (1), the relative centrifugal force F' can also be increased by increasing the revolution speed N of the carrier 310 or increasing the radius R of the track 300. However, it would be more convenient to increase the revolving speed N instead of physically adjusting the track 300 just to increase the radius R.

In summary, the advantages of the invention include:

1. The invention is capable of removing any voids inside a film layer on a silicon wafer.

2. The invention is capable of reducing the topographical height difference of a film layer.

3. The invention is capable of reducing the time needed to planarize a film layer.

4. Productivity can be increased by increasing the revolution speed of the carrier so that the centrifugal force is increased and the film layer becomes more fluid.

5. Surface planarity of a silicon wafer can be improved to such a level that the topographical height difference from the center of a wafer to its rim is only about 0.02 percentage.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A device for planarizing a film layer on a silicon wafer in a semiconductor manufacturing, comprising:

a circular track whose surface faces a track center;

a carrier capable of moving along the track, wherein the carrier is used for carrying the silicon wafer with the face of the wafer facing the track center; and a set of heating elements within the planarizing device for heating the wafer so that the film layer on the wafer becomes fluid.

2. The device of claim 1, wherein the heating elements are installed within the carrier.

3. The device of claim 1, wherein the heating elements are installed along the track.

4. A method for planarizing a film layer, comprising the steps of:

providing a silicon wafer;

depositing a film layer over the silicon wafer; and planarizing the film layer by placing the wafer inside a planarizing device, moving the wafer around in a circular path with a front surface of the wafer facing a center of the circular path, and heating the wafer to make the film layer fluid.

5. The method of claim 4, wherein the planarization device comprises:

a circular track whose surface faces a track center;

a carrier capable of moving along the track, wherein the carrier is used to carry the wafer; and a set of heating elements within the planarizing device for heating the film layer.

6. A method for planarizing a film layer, comprising the steps of:

providing a silicon wafer;

depositing a film layer over the wafer;

providing a planarizing device that includes:

a circular track whose surface faces a track center;

a carrier capable of moving along the track; and a set of heating elements within the planarizing device for heating the film layer; and planarizing the film layer by placing the wafer inside the planarizing device, moving the wafer along a circular path with a front surface of the wafer facing the track center, and heating the wafer to make the film layer fluid.

7. The method of claim 6, wherein the heating elements are installed within the carrier.

8. The method of claim 6, wherein the heating elements are installed along the track.

* * * * *